United States Patent
Au Yeung et al.

(10) Patent No.: US 10,418,978 B1
(45) Date of Patent: Sep. 17, 2019

(54) DUTY CYCLE CONTROLLER WITH CALIBRATION CIRCUIT

(71) Applicant: Hong Kong Applied Science and Technology Research Institute Company, Limited, Hong Kong (HK)

(72) Inventors: Chung Fai Au Yeung, Hong Kong (HK); Gordon Chung, Hong Kong (HK); Hok San Yu, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 16/253,446

(22) Filed: Jan. 22, 2019

(51) Int. Cl.
*H03K 3/017* (2006.01)
(52) U.S. Cl.
CPC .................... *H03K 3/017* (2013.01)
(58) Field of Classification Search
CPC ....................................................... H03K 3/017
See application file for complete search history.

(56) References Cited

U.S. PATENT DOCUMENTS

| | | | |
|---|---|---|---|
| 6,061,418 A | 5/2000 | Hassoun | |
| 6,121,805 A | 9/2000 | Thamsirianunt et al. | |
| 6,297,815 B1 | 10/2001 | Byun | |
| 6,307,356 B1 | 10/2001 | Dwelley | |
| 7,525,360 B1 | 4/2009 | Wang et al. | |
| 8,130,016 B2 | 3/2012 | Nagarajan et al. | |
| 8,669,799 B1 | 3/2014 | King | |
| 9,148,135 B2 | 9/2015 | Li | |
| 9,711,189 B1 * | 7/2017 | Wang | G11C 11/4074 |
| 9,762,211 B2 * | 9/2017 | Lau | H03K 3/017 |
| 9,780,768 B2 * | 10/2017 | Elbadry | H03K 5/1565 |
| 9,817,047 B2 * | 11/2017 | Jenkins | G01R 29/0273 |
| 10,003,328 B1 * | 6/2018 | Yin | H03K 5/156 |

(Continued)

FOREIGN PATENT DOCUMENTS

| | | |
|---|---|---|
| CN | 103441720 A | 12/2013 |
| CN | 103929152 A | 7/2014 |

(Continued)

OTHER PUBLICATIONS

ISR and Written Opinion, PCT/CN2019/073030, dated Mar. 4, 2019.

*Primary Examiner* — Kenneth B Wells
(74) *Attorney, Agent, or Firm* — Stuart T. Auvinen; gPatent LLC

(57) ABSTRACT

An integrator in a duty-cycle adjustment circuit has an adjustable charging current provided by a switched current-source array in response to configuration signals from the calibration logic. The integrator's ramp voltage is compared to a threshold voltage by a comparator to generate an output clock. A tunable voltage reference generates a reference voltage that can be tuned by configuration signals from the calibration logic. The reference voltage is divided by a tunable voltage divider, which selects different fractions of the reference voltage for use as the threshold voltage. During calibration, calibration logic repeatedly raises the reference voltage or reduces the charging current from the switched current-source array until a peak voltage of the ramp voltage equals the reference voltage, when a zero duty onset detector detects that the output clock has stopped pulsing. The configuration signals at the zero duty onset condition are stored and used for normal operation.

20 Claims, 14 Drawing Sheets

(56) References Cited

U.S. PATENT DOCUMENTS

| | | | |
|---|---|---|---|
| 10,110,239 B1* | 10/2018 | Shu | H03L 7/0814 |
| 10,181,844 B1* | 1/2019 | Fu | H03L 7/085 |
| 10,249,354 B1* | 4/2019 | Lee | G11C 7/22 |
| 10,270,429 B1* | 4/2019 | Wang | G11C 29/023 |
| 2003/0222803 A1 | 12/2003 | Cohen et al. | |
| 2010/0225372 A1 | 9/2010 | Satoh et al. | |
| 2013/0099840 A1 | 4/2013 | Lee et al. | |
| 2014/0125390 A1 | 5/2014 | Ma | |

FOREIGN PATENT DOCUMENTS

| | | |
|---|---|---|
| CN | 105518986 A | 4/2016 |
| KR | 100960799 B | 6/2010 |

* cited by examiner ial application, and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

DUTY CYCLE CONTROLLER WITH CALIBRATION CIRCUIT

FIELD OF THE INVENTION

This invention relates to synchronization, and more particularly to duty-cycle adjustment and calibration.

BACKGROUND OF THE INVENTION

Re-synchronization or clock adjustment may be needed for various systems, or for the interfaces between various systems. Video systems in particular may benefit from timing adjustment. More recently, 3D conversion of video content is performed on various devices, such as a handheld, headset display, or a larger display system. Such devices may use a System-On-a-Chip (SOC) to convert video streams by adjusting or tuning various clocks.

Even when clocks are synchronized to the same frequency, data may be mis-clocked. FIG. 1 is a waveform diagram of tuning a clock to correct for a duty-cycle error. The falling edge of CLK causes both DATA 1 and DATA 2 to change state. However, DATA1 is much faster than DATA2, such as due to differences in propagation delays in a circuit. Both DATA1 and DATA2 are sampled, latched, or clocked in on the rising edge of CLK. DATA1 is faster to become stable, allowing BIT11, BIT12, and BIT13 to be sampled at successive rising edges of CLK.

However, the longer propagation delay for DATA2 causes its data BIT21, BIT22, to become stable after the rising edge of CLK. If CLK were used to sample DATA2, the wrong data could be captured. A synchronization failure would occur.

The clock can be tuned to allow more time for slower signals to finish propagation. The clock frequency is held constant, but the duty cycle is adjusted. In this example, the rising edge of CLK is delayed while the rising edge of CLK is held constant. The resulting tuned clock TUNED CLK has the same frequency and period of CLK, but has a smaller duty cycle. The rising edge of CLK is delayed by time T to generate TUNED CLK. The delayed rising clock edge of TUNED CLK allows more time for DATA2 to propagate and become stable, so that BIT21 and BIT22 are successfully captured by TUNED CLK but not by CLK.

The longer delay of DATA2 may be due to actual signal propagation paths that generate DATA2, or may be due to signal timings generated by another system, such as a video stream with skewed timing. Such timing variances can be compensated for by tuning the duty cycle.

A tuned clock with an adjustable duty cycle can be generated with an integrator. FIG. 2 is a waveform diagram of an integrator adjusting the duty cycle to generate a tuned clock. An integrator can have a charge pump that charges and discharges a capacitor to generate a triangle wave. The INTEGRATOR waveform is a triangle wave. A voltage threshold THRESHOLD can be set and compared to the triangle wave. When the triangle waveform is above the threshold, then the output is driven high; otherwise the output is driven low. The resulting output OUT has the same frequency set by the integrator, but the duty cycle can be adjusted by adjusting the voltage of the threshold. Lowering the threshold causes the duty cycle to increase since more of the triangle wave is above the threshold, resulting in a longer high pulse for the output OUT.

While using an integrator to adjust the duty cycle is useful, integrators often are quite sensitive to variations in temperature, supply voltage, and manufacturing process. This sensitivity can degrade the precision of any resulting tuned clock. As a system heats up during operation, or as the power supply fluctuates due to varying loading, the resulting tuned clock can drift and no longer have its clock edge in the correctly timed position. Synchronization failures can reappear.

What is desired is a clock generator with an adjustable duty cycle. A duty-cycle controller that adjusts the duty cycle of a clock is desirable. A calibration circuit that calibrates a configuration of the duty cycle controller is desirable to more precisely adjust the duty cycle.

DETAILED DESCRIPTION

The present invention relates to an improvement in duty-cycle controllers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
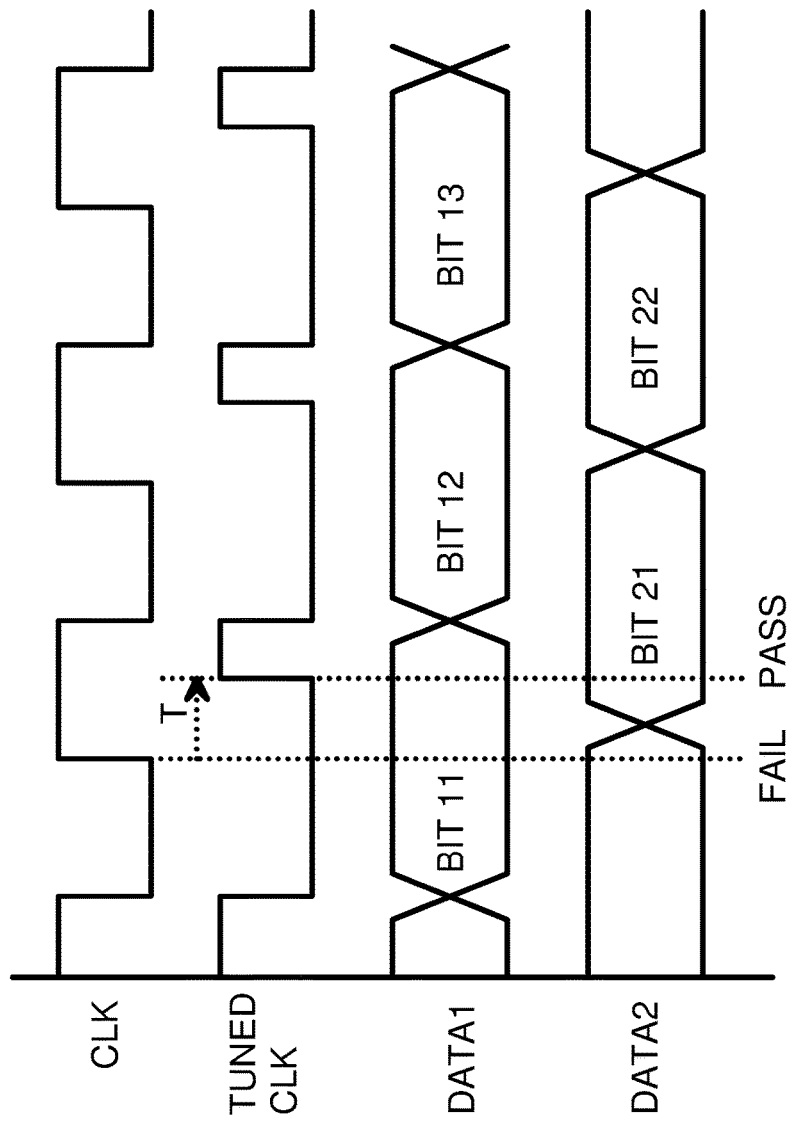
FIG. 1 is a waveform diagram of tuning a clock to correct for a duty-cycle error.
Figure 2:
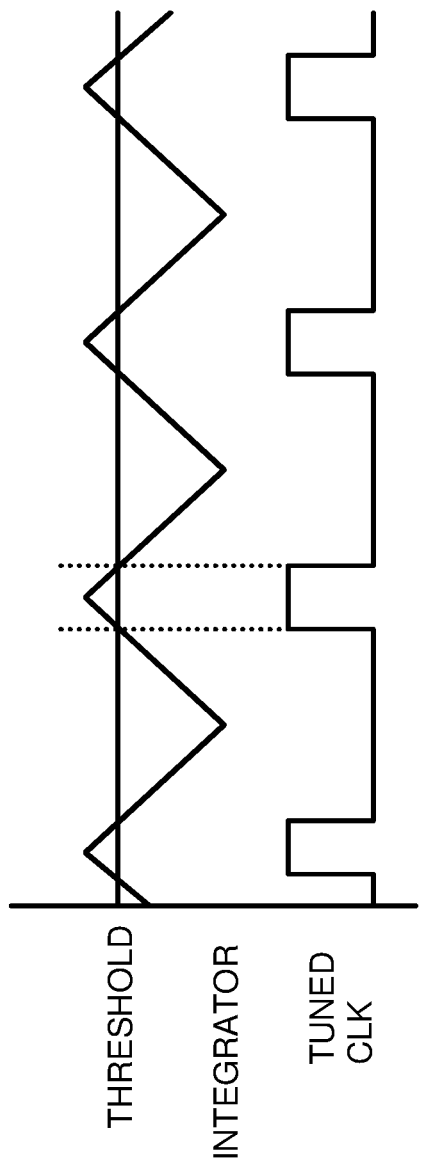
FIG. 2 is a waveform diagram of an integrator adjusting the duty cycle to generate a tuned clock.
Figure 3:
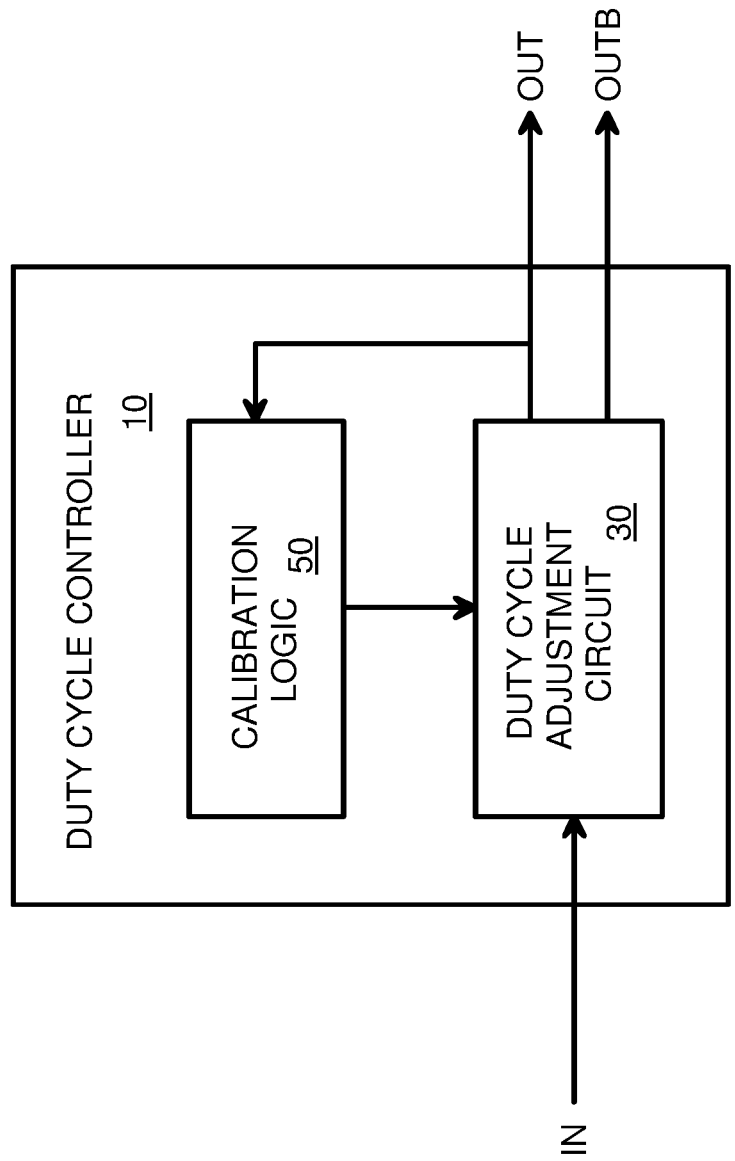
FIG. 3 is a block diagram of a duty-cycle controller.

FIG. 3 is a block diagram of a duty-cycle controller. Duty-cycle controller 10 receives an input clock IN and generates an output clock OUT with the same frequency, but with an adjusted duty cycle. Duty-cycle adjustment circuit 30 uses an integrator to generate a triangular wave that is compared to a variable threshold voltage to generate the output clock OUT.

Calibration logic 50 examines the output clock OUT to adjust the configuration of duty-cycle adjustment circuit 30. The adjustments to the configuration of duty-cycle adjustment circuit 30 can include adjusting components of the variable threshold and adjusting the current in the integrator.

These configuration adjustments can track changes in temperature and supply voltage and also account for process skews.

Figure 4:
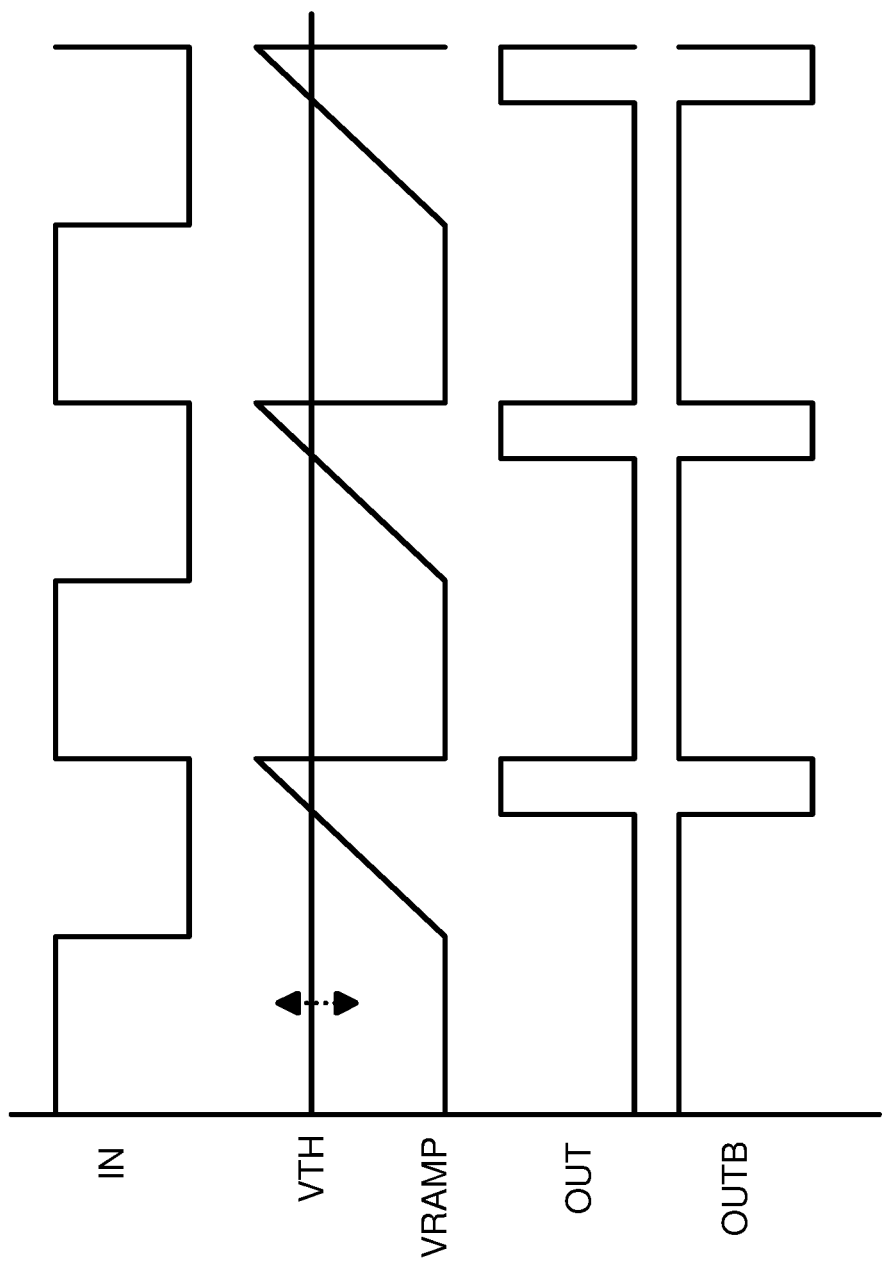
FIG. 4 is a waveform diagram of the duty-cycle adjustment circuit.

FIG. 4 is a waveform diagram of the duty-cycle adjustment circuit. An input clock IN controls the integrator to slowly charge and rapidly discharge a capacitor to generate a triangular or saw-wave voltage ramp VRAMP. Charging occurs when IN is low, and the rising edge of IN quickly discharges the capacitor, dropping VRAMP to ground.

A variable threshold voltage VTH is compared to VRAMP by a comparator.

When VRAMP is above VTH, OUT is driven high, otherwise OUT is driven low. OUTB is generated as the inverse of OUT.

The threshold voltage VTH can be adjusted down to increase the time that OUT is high, thus increasing the duty cycle. When VTH is adjusted upward, the high pulse width of OUT is reduced, reducing the duty cycle.

The duty cycle can be adjusted from 50% to 0% on OUT, when the input clock IN has a 50% duty cycle. The duty-cycle adjustment is limited to be some fraction of the low pulse of IN. However, when a duty-cycle of greater than 50% is desired, the inverse output OUTB can be used as the output clock, since as OUT falls from 50% to 0%, OUTB increases from 50% to 100%. A mux or clock selector (not shown) can be used to connect either OUT or OUTB to the system as needed.

Figure 5:
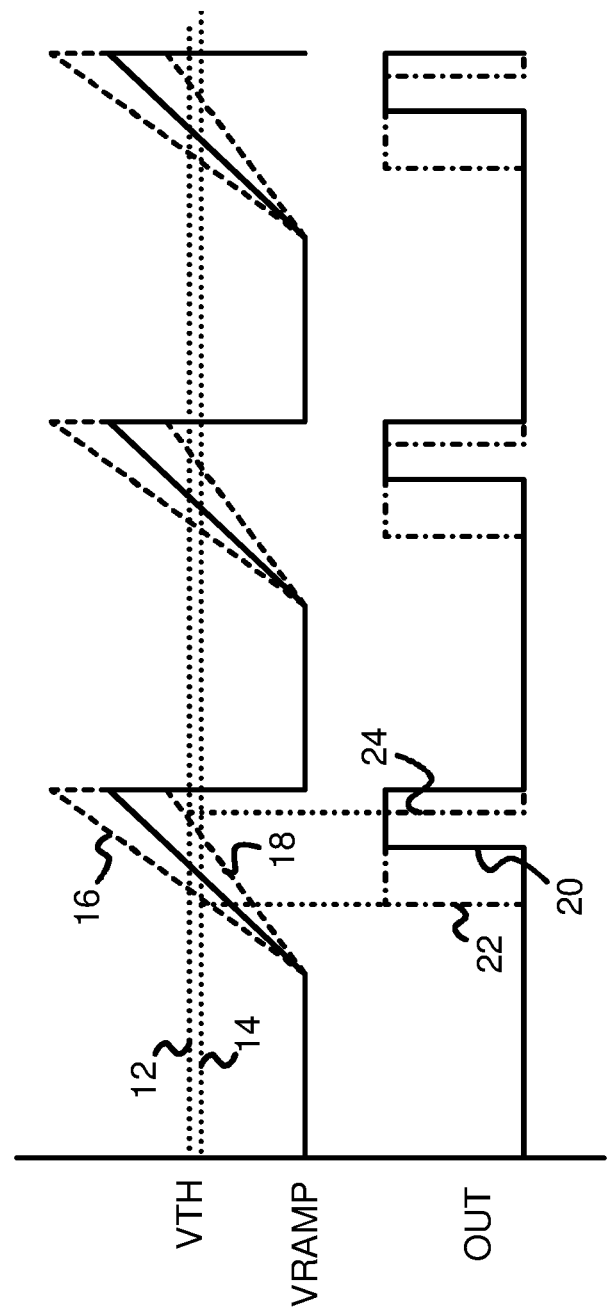
FIG. 5 is a waveform diagram showing voltage variations that are due to process variations.

FIG. 5 is a waveform diagram showing voltage variations that are due to process variations. Ramp voltage VRAMP can be particularly sensitive to process variations that vary the charging current and the capacitance. VRAMP may have a range of waveforms between maximum VRAMP 16 and minimum VRAMP 18.

The threshold voltage is less sensitive to process variations, especially when a bandgap reference is used. Threshold voltage VTH can vary from maximum threshold 12 to minimum threshold 14 due to process variations.

For a typical or average process, typical rising edge 20 of output clock OUT occurs when the typical VRAMP equals the typical VTH when VRAMP is rising. However, the process variations cause early rising edge 22 to occur where maximum VRAMP 16 crosses over minimum threshold 14. Another extreme combination of process variations causes late rising edge 24 of output clock OUT to occur where minimum VRAMP 18 crosses over maximum threshold 12.

The range between early rising edge 22 and late rising edge 24 of clock OUT can be significant. Video conversion may need to be slowed down if timings cannot be met over this wide range. Performance may suffer.

Calibration is used to determine the particular process variation for this particular circuit. Once calibration determines the process variation, then the configuration of duty-cycle adjustment circuit 30 (FIG. 3) can be adjusted to compensate for this process variation detected by calibration logic 50. Calibration can detect where VRAMP is within the range from maximum VRAMP 16 to minimum VRAMP 18, and then shrink the range from early rising edge 22 to late rising edge 24 of the rising edge of output clock OUT.

Figure 6:
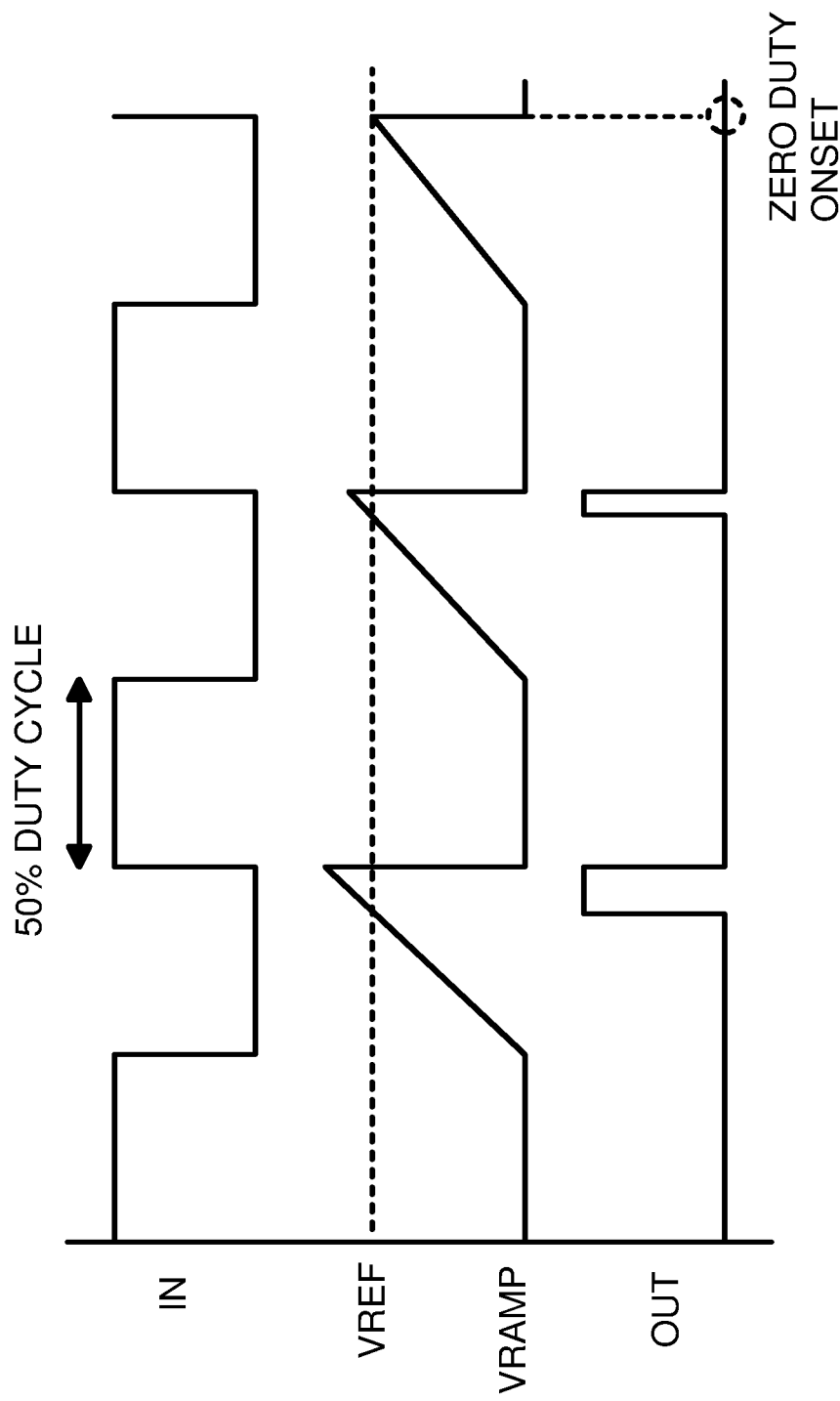
FIG. 6 is a waveform diagram highlighting calibration to match VRAMP to a reference.

FIG. 6 is a waveform diagram highlighting calibration to match VRAMP to a reference. During calibration, the input clock remains at a 50% duty cycle, but the threshold voltage VTH is set to a reference voltage VREF. VREF can be at the upper limit of the range that VTH can be varied over. The signal strength of VRAMP is gradually reduced over many cycles of IN. The signal strength can be reduced by reducing the strength of the charging current in the integrator. With a weaker current, longer time is needed to charge the capacitor, and the peak voltage of VRAMP is reduced.

At first, the peak voltage of VRAMP is above the reference voltage VREF before the next rising edge of input clock IN, resulting in a pulse of the output clock OUT. As the signal strength is gradually reduced, the peak voltage is reduced for successive clock cycles, and the pulse width of OUT is also successively reduced since VRAMP spends less time above reference voltage VREF.

Eventually the peak voltage of VRAMP equals VREF, and the pulse width of OUT reaches zero. No pulse occurs for OUT. This is a duty cycle of zero. This missing pulse of OUT is detected and signals a zero duty onset condition to calibration logic 50. The zero duty onset occurs when the peak voltage of VRAMP equals the reference voltage VREF so that the duty cycle becomes zero. The signal strength or charging current used when the zero duty onset condition is detected is saved as a reference condition for the configuration by calibration logic 50.

Figure 7:
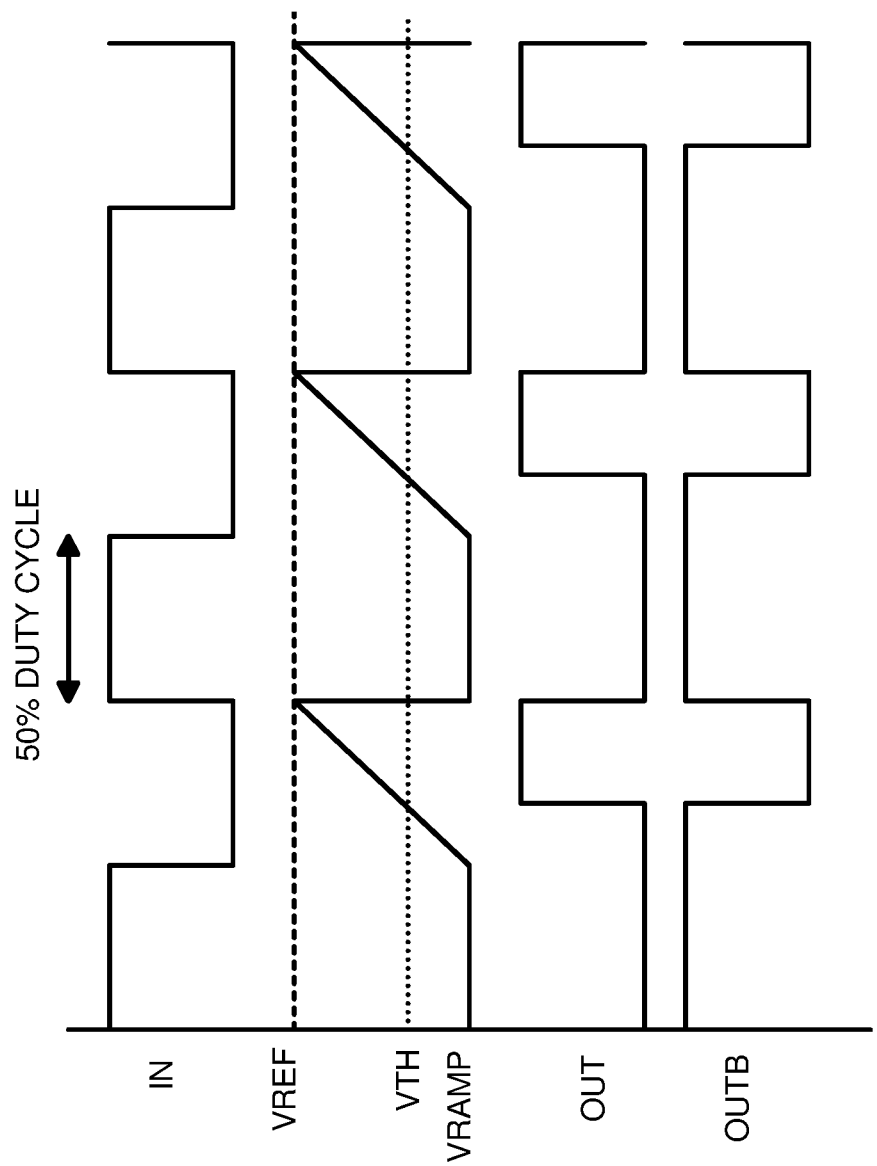
FIG. 7 is a waveform diagram showing generation of a desired duty cycle after calibration.

FIG. 7 is a waveform diagram showing generation of a desired duty cycle after calibration. The charging current used to generate the zero duty onset condition is saved as part of the configuration, and applied to duty-cycle adjustment circuit 30. Thus the peak voltage of VRAMP is equal to VREF for all clock cycles, as shown in FIG. 7.

The threshold voltage VTH is set to be a fraction of VREF using divisor K, where VTH=VREF/K, where K is one or more. When K is 1, VTH is VREF, and the duty cycle is at the zero duty cycle onset condition and the output duty cycle is zero. The duty cycle can be adjusted to any desired value by selecting a value for K that satisfies the equation:

$$DUTY_{OUT}=0.5(1-1/K)$$

when OUT is used for duty cycles between 0% and 50%, or $$DUTY_{OUTB}=0.5(1+1/K)$$

when OUTB is used for duty cycles between 50% and 100%.

The system designer can select the desired duty cycle for a typical process, and then have calibration logic 50 adjust the charging current to automatically compensate for temperature, supply voltage, and process variations. Calibration logic 50 matches the charging current in the integrator to output a peak voltage of VRAMP that equals the reference voltage VREF.

Figure 8:
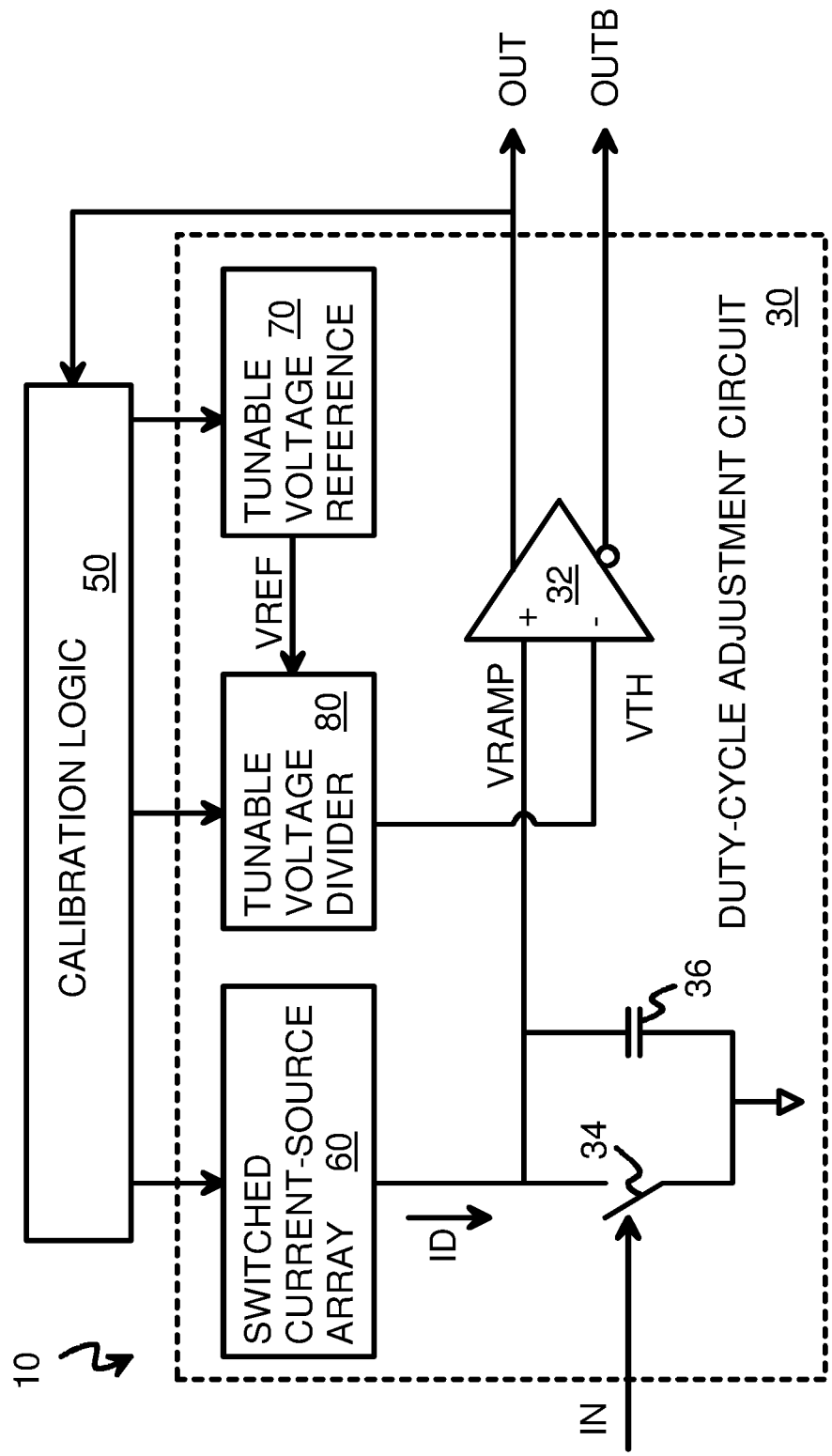
FIG. 8 is a block diagram showing details of the duty-cycle controller with calibration.

FIG. 8 is a block diagram showing details of the duty-cycle controller with calibration. An input clock IN is input to duty-cycle controller 10, which generates a duty-cycle adjusted clock OUT and its inverse OUTB. A system could select OUT when the desired duty cycle is less than 50%, or OUTB when the duty cycle is more than 50%.

Calibration logic 50 detects a zero duty onset condition when a pulse of output clock OUT is missing during a calibration routine. Calibration logic 50 adjusts configuration settings that control duty-cycle adjustment circuit 30. These configuration settings control the charging current ID generated by switched current-source array 60, the reference voltage VREF generated by tunable voltage reference 70, and the divisor K that the reference voltage VREF is divided by using tunable voltage divider 80 to produce the threshold voltage VTH.

A charging current ID is provided by switched current-source array 60 to charge capacitor 36 when switch 34 is open. When switch 34 closes, capacitor 36 is quickly discharged to ground, and any charging current from switched current-source array 60 is also shunted to ground. Switch 34 can sink a much larger current than charging current ID.

Switched current-source array 60, switch 34, and capacitor 36 together function as an integrator to generate a saw-tooth waveform (FIG. 7) on ramp voltage VRAMP. Comparator 32 compares VRAMP to threshold voltage VTH and drives output clock OUT high and OUTB low when VRAMP is above VTH. When VRAMP is below VTH, comparator 32 drives OUT low and OUTB high.

Threshold voltage VTH is generated by tunable voltage divider 80 by dividing reference voltage VREF by a divisor K. One or more configuration signals from calibration logic 50 controls tunable voltage divider 80 to divide by K. The divisor K can be selected by the configuration signals, which could be mux-control signals rather than a numerical value for K.

The reference voltage VREF is generated by tunable voltage reference 70 in response to configuration signals from calibration logic 50. During calibration, calibration logic 50 can adjust these configuration signals to adjust VREF. When the zero duty onset is not detected, calibration logic 50 can adjust VREF higher using configuration signals to tunable voltage reference 70.

Figure 9:
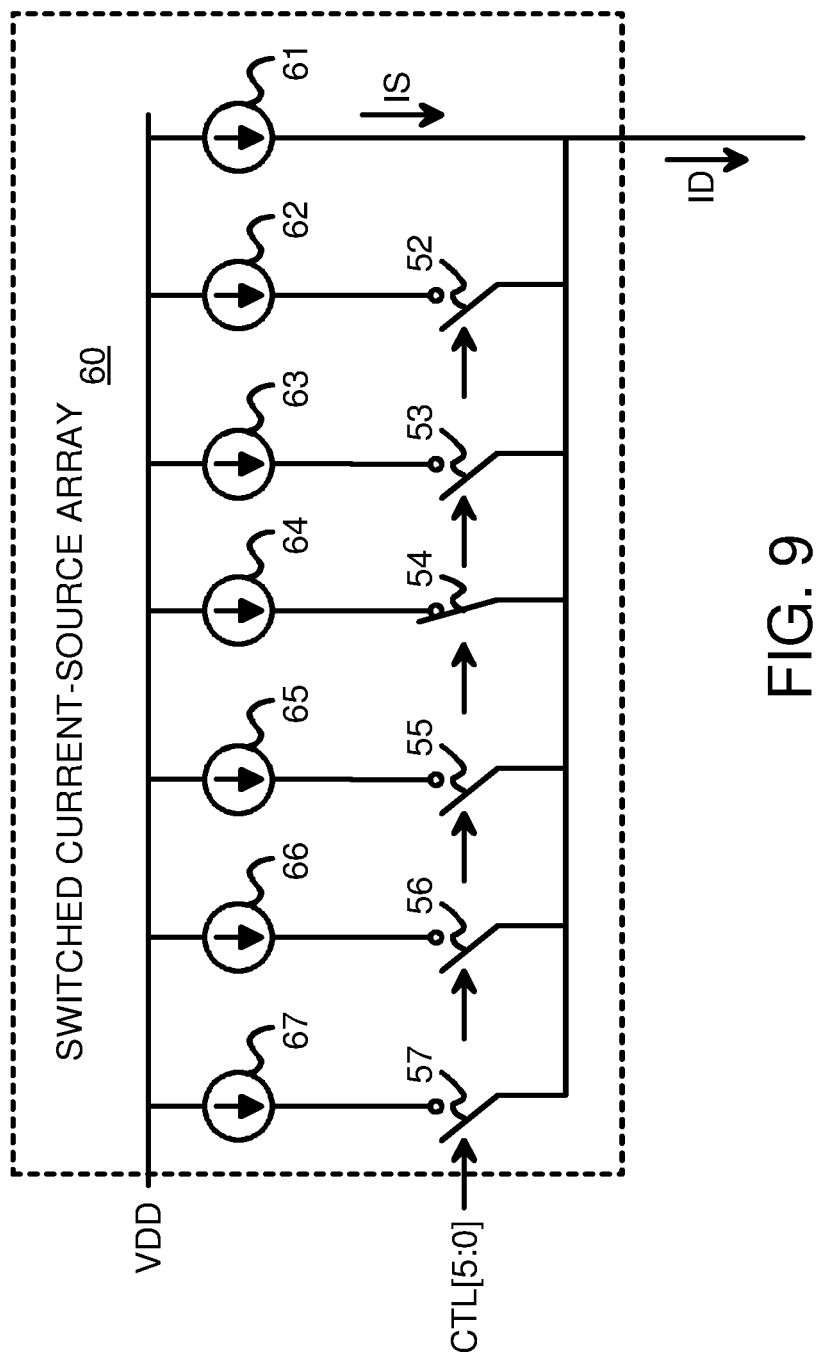
FIG. 9 shows the switched current-source array in more detail.

FIG. 9 shows the switched current-source array in more detail. Current source 61 connected to the power supply VDD provides a constant source current IS to the charging current ID. This constant current IS is the minimum value of charging current ID. Other current sources 62-67 are connected by switches 52-57 to add their currents to charging current ID when their respective switches 52-57 are closed by configuration signals CTL[5:0]. Configuration signals CTL[5:0] are generated by calibration logic 50 and their final values upon the successful completion of a calibration sequence are stored by calibration logic 50 for use during normal operation between calibration cycles.

Figure 10:
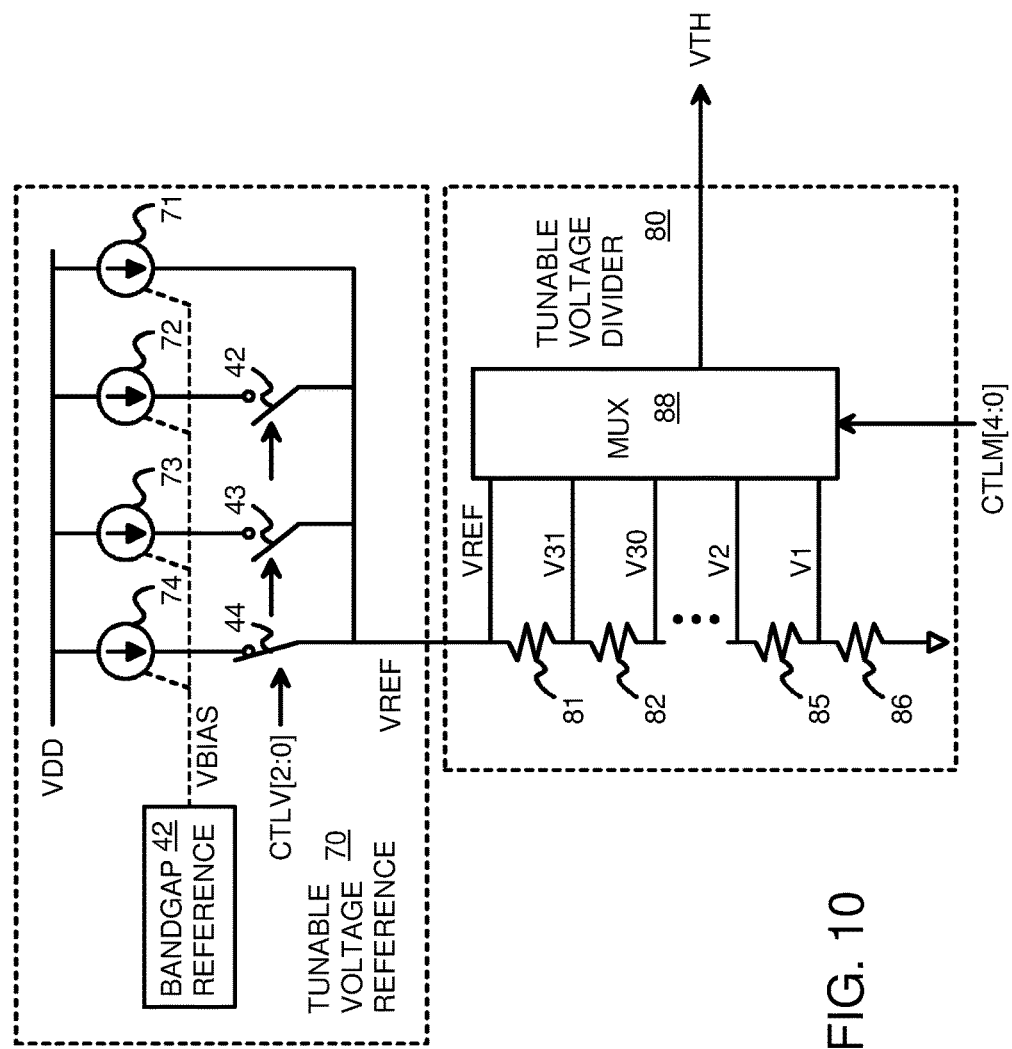
FIG. 10 is a diagram of the tunable voltage reference and the tunable voltage divider.

FIG. 10 is a diagram of the tunable voltage reference and the tunable voltage divider. Bandgap reference generator 42 provides a stable bias voltage VBIAS that is relatively independent of power-supply, temperature, and process. This band-gap bias voltage VBIAS controls the amount of current generated from VDD by current sources 71-74 when switches 42-44 are closed. Current source 71 provides a constant minimum current while current sources 72-74 add their currents when their switches 42-44 are closed. The combined current from all enabled current sources 71-74 flows through a series of resistors 81, 82, . . . 85, 86 to ground. The reference voltage VREF is the voltage of the node at the top of first resistor 81, and includes the sum of all IR voltage drops through all of the resistors 81-86 in series.

Calibration logic 50 can adjust VREF by changing configuration signals CTLV[2:0] which control switches 42-44. For example, when CTLV[2:0] is 000, switches 42-44 are all open, and only the current from current source 71 flows through series of resistors 81, 82, . . . 85, 86. This produces the lowest voltage drop and the minimum value of VREF. When CTLV[2:0] is 111, switches 42-44 are all closed, and all four currents from current sources 71-74 flow through series of resistors 81, 82, . . . 85, 86. This largest combined current produces the largest voltage drop and the maximum value of VREF.

During calibration, mux 88 in tunable voltage divider 80 is controlled by calibration logic 50 to select its top input, so that VREF is connected to VTH. Once calibration is completed, calibration logic 50 drives configuration signals CTLM[4:0] to values that correspond to the desired divisor K. These configuration signals CTLM[4:0] are applied to the control inputs of mux 88 and cause mux 88 to select one of its inputs to connect to its output, threshold voltage VTH. The inputs to mux 88 are tap nodes between series of resistors 81, 82, . . . 85, 86, as well as VREF. Each successive mux input selects a smaller voltage value in the voltage divider of series of resistors 81, 82, . . . 85, 86. For example, Vi is smaller than V32 and corresponds to a large divisor K.

Figure 11:
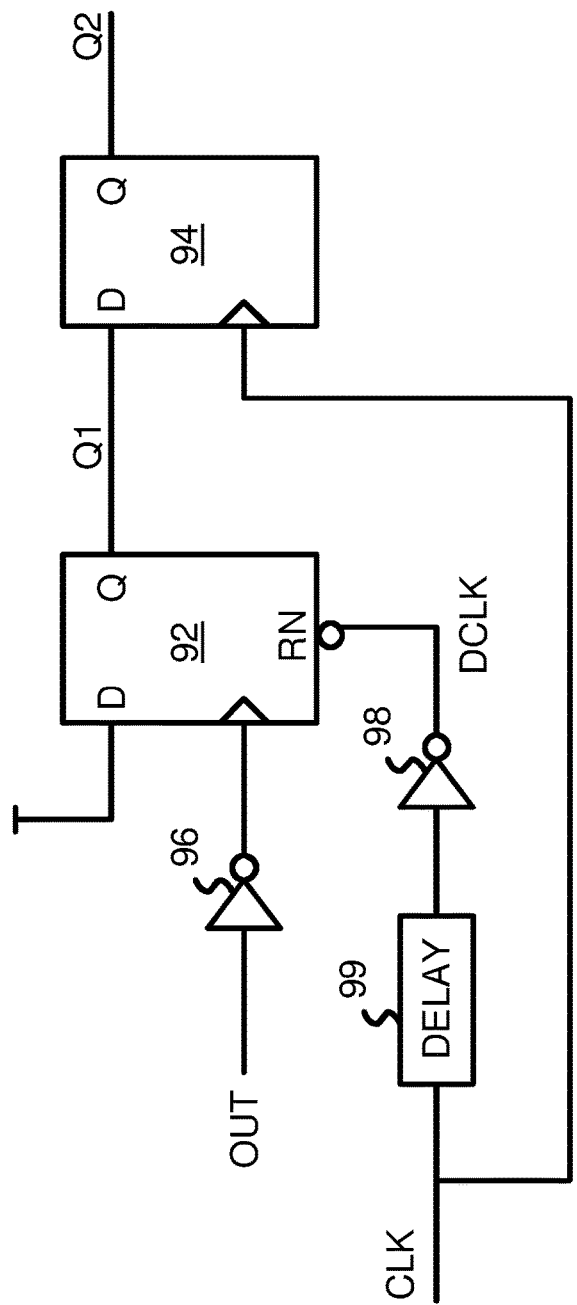
FIG. 11 is a zero duty onset detector.

FIG. 11 is a zero duty onset detector. The zero duty onset condition occurs when the peak voltage of VRAMP is less than the threshold voltage VTH, which is sent to the reference voltage VREF during calibration. When this occurs, the pulse width of output clock OUT shrinks to zero. The missing pulse is detected by the zero duty onset circuit of FIG. 11. This zero duty onset detector can be part of calibration logic 50, or calibration logic 50 can examine output Q2 of the zero duty onset detector.

The input clock IN either directly or indirectly drives local clock CLK. The local clock CLK can be a slightly delayed version of input clock IN with the same frequency. This clock CLK is delayed by delay line 99 and inverted by inverter 98 to generate delayed clock DCLK that resets first flip-flop 92. Output clock OUT is inverted by inverter 96 and applied to the clock input of first flip-flop 92. When OUT goes from high to low, a one from the D input of first flip-flop 92 is clocked to its Q output, signal Q1. Signal Q1 is applied to the D input of second flip-flop 94, which is clocked by CLK. On the rising edge of CLK, Q1 from first flip-flop 92 is clocked to Q2 of second flip-flop 94. During normal operation, the continuous pulses of output clock OUT cause both flip-flops to be clocked, causing Q1 to be clocked high and reset low each clock cycle, while Q2 remains high. However, when a pulse of OUT is missing, the Q1 pulse will also be missing, and Q2 will get clocked low. The low condition of Q2 indicates the zero duty onset condition.

Figure 12:
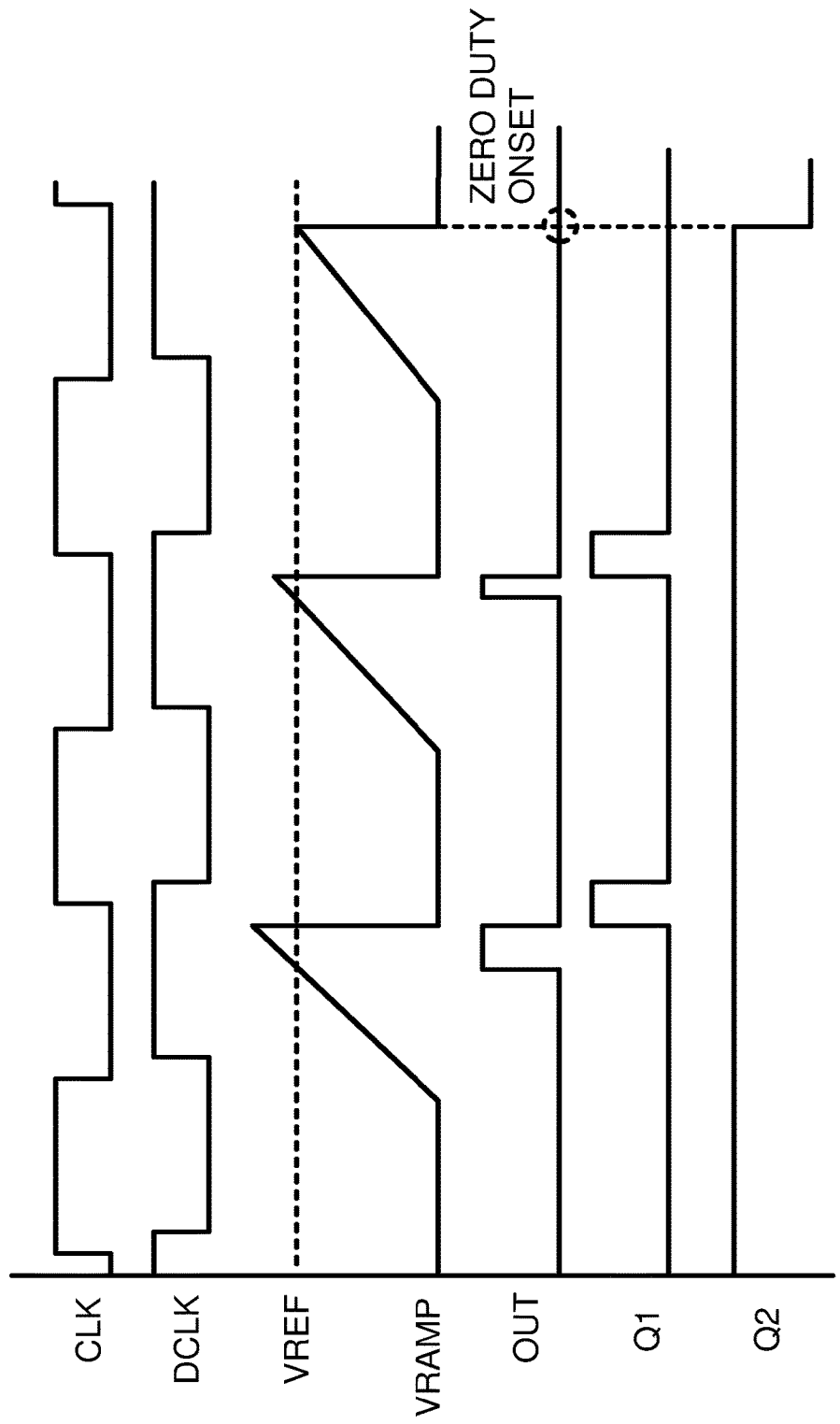
FIG. 12 is a waveform diagram of operation of the zero duty onset detector of FIG. 11.

FIG. 12 is a waveform diagram of operation of the zero duty onset detector of FIG. 11. CLK is the delayed input clock IN and delayed clock DCLK is the inverted and delayed clock. During calibration, the peak voltage of VRAMP is successively lowered as calibration logic 50 adjusts configuration signals CTL[5:0] to reduce the charging current ID generated by switched current-source array 60.

As long as the peak voltage of VRAMP is above the threshold, which is set equal to reference voltage VREF during calibration by mux 88 selecting the top mux input, a pulse of the output clock OUT is generated by comparator 32 in duty-cycle adjustment circuit 30. This OUT pulse clocks a high value into first flip-flop 92, causing Q1 to pulse high until reset by the delayed clock DCLK going low.

The lower peak voltages of VRAMP produce shorter and shorter pulses of OUT and Q1, until finally no OUT pulse is generated when the peak voltage of VRAMP falls below VREF. Since OUT is not pulsed, Q1 stays low, and second flip-flop 94 clocks this low Q1 to its Q2 output. The low Q2 signals to calibration logic 50 that the zero duty onset condition has been detected.

Figure 13:
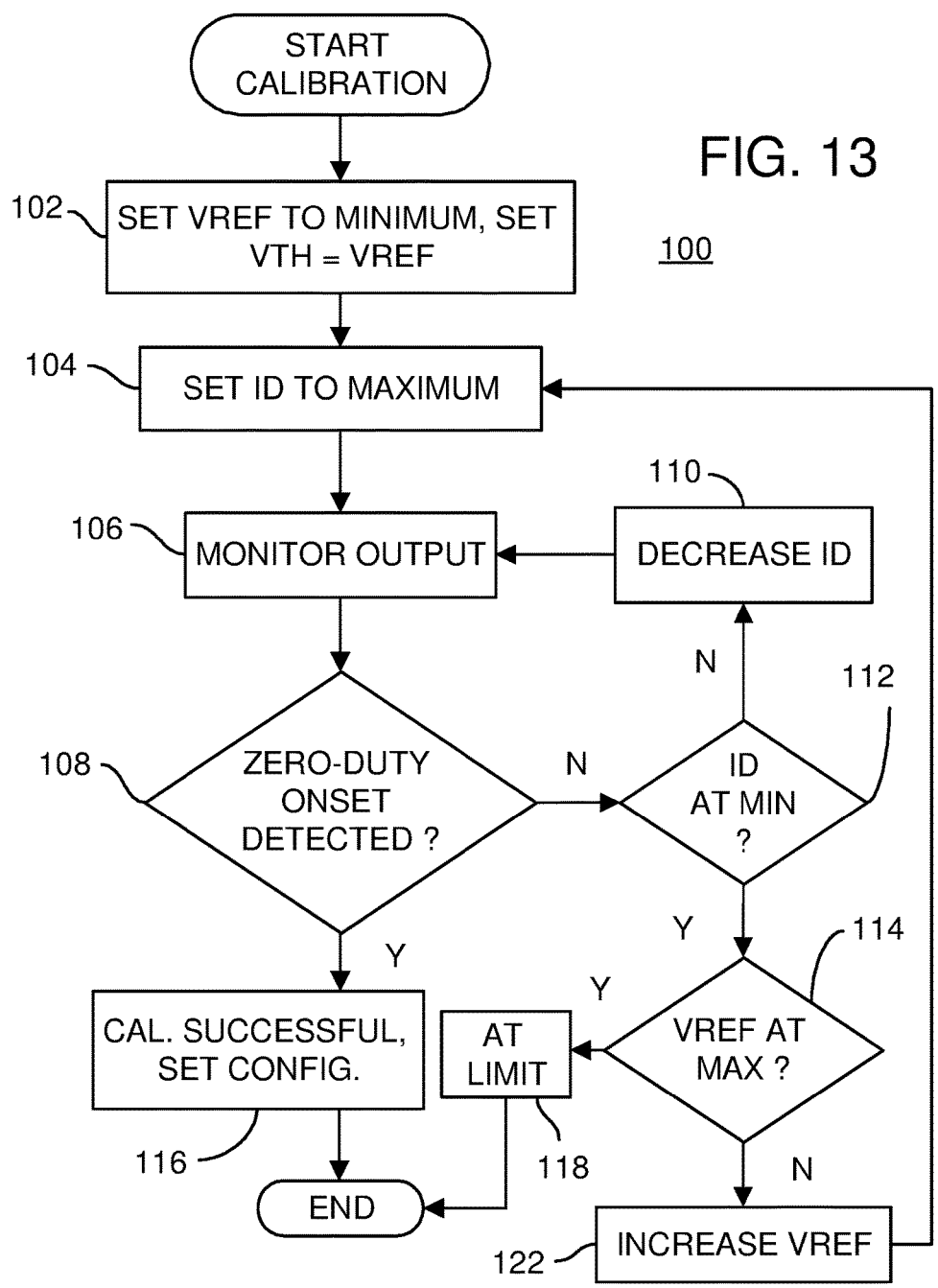
FIG. 13 is a flowchart of a calibration process.

FIG. 13 is a flowchart of a calibration process. Calibration can be initiated when the device is powered up, and periodically, such as every hour, minute, or second, and this period could be programmable. Calibration could also be initiated by external events, such as by a receiver detecting a large number of errors, or a temperature monitor detecting a change in temperature, or a supply monitor detecting a variation in supply voltage.

Once calibration process 100 has been initiated, calibration logic 50 sets VREF to its minimum value, and sets VTH to be equal to VREF, step 102. Configuration signals CTLV [2:0] are set to open switches 42, 43, 44 (FIG. 10) so that only the current from current source 71 flows through the voltage divider of series of resistors 81, 82, . . . 85, 86. This minimum current produces the minimum voltage drop through series of resistors 81, 82, . . . 85, 86, and the smallest VREF. Calibration logic 50 also sets configuration signals CTLM[4:0] to a value that causes VRERF to be selected by mux 88 to drive VTH.

Calibration logic 50 also sets the charging current ID to its maximum value, step 104. Calibration logic 50 sets configuration signals CTL[5:0] to a value such as 111111 so that all of switches 52-57 (FIG. 9) are closed. The maximum charging current ID is the sum of all currents from current sources 61-67.

The output clock OUT is monitored, step 106, such as using the zero duty onset detector of FIG. 11. When Q2 from the zero duty onset detector falls to zero, the zero duty onset condition is detected, step 108. At this point, the peak voltage of VRAMP equals VREF, and the pulse of OUT disappears, or is too small to be clocked into a flip-flop. When the zero duty onset is detected, step 108, then calibration is successful, and the most recent setting of the configuration signals can be stored and set as the calibrated configuration to use for normal operation of duty-cycle adjustment circuit 30, step 116.

When the zero duty onset is not yet detected, step 108, then more calibration is required. When the charging current ID is not at its minimum value, step 112, then calibration logic 50 adjusts the configuration signals to reduce the charging current, such as by turning off one of current sources 61-67 by opening one of switches 52-57. Once charging current ID is reduced, step 110, then the signal strength of the VRAMP signal is reduced, and its peak voltage is also reduced. Then the output from the zero duty onset detector is again examined by calibration logic 50, step 106, and if zero duty onset is still not detected, step 108, then the charging current can be reduced further, step 110, when the charging current ID has not yet reached its minimum setting, step 112.

During calibration when the charging current ID reaches its minimum setting, step 112, and reference voltage VREF is not at its maximum setting, step 114, then VREF can be increased, step 122, such as by calibration logic 50 adjusting configuration signals CTLV[2:0] to close another one of switches 42-44, thus enabling more of current sources 72-74 to add current to flow through the voltage divider of series of resistors 81, 82, . . . 85, 86, thus increasing VREF. Then the charging current is reset to its maximum setting, step 104, and the testing for zero duty onset resumed, steps 106, 108.

During calibration when the charging current ID reaches its minimum setting, step 112, and reference voltage VREF is also at its maximum setting, step 114, then no more configuration adjustments are possible, and calibration ends due to its adjustment limits being reached, step 118. An error handling routine could be activated. The most recent configuration used by duty-cycle adjustment circuit 30 before calibration was attempted may be re-applied.

Figure 14:
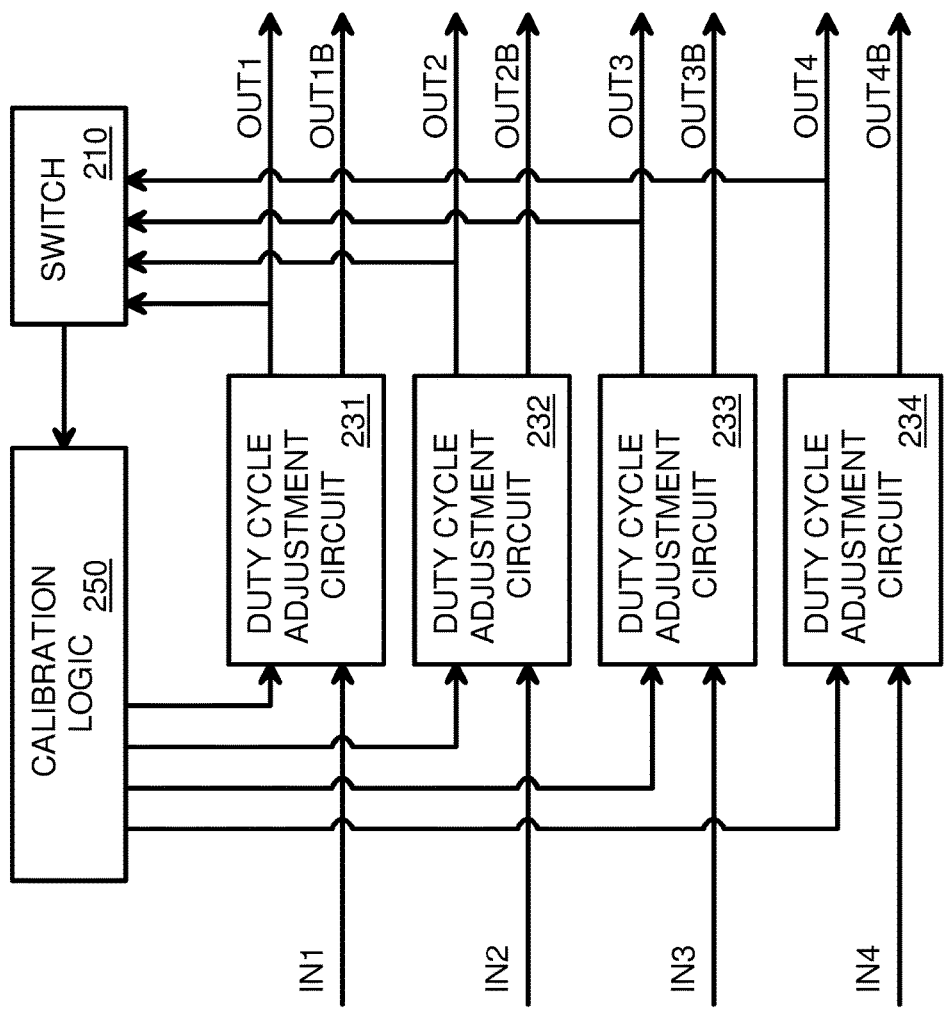
FIG. 14 is a block diagram of sharing calibration logic with many duty-cycle adjustment circuits.

FIG. 14 is a block diagram of sharing calibration logic with many duty-cycle adjustment circuits. Calibration logic 250 has multiple configuration registers, each storing a set of the configuration signals CTL[5:0], CTLV[2:0], and CTLM [4:0] for a different one of duty-cycle adjustment circuits 231-234.

Duty-cycle adjustment circuit 231 receives input clock IN1 and generates output clock OUT1 and its inverse OUT1B. Duty-cycle adjustment circuit 232 receives input clock IN2 and generates output clock OUT2 and its inverse OUT2B. Duty-cycle adjustment circuit 233 receives input clock IN3 and generates output clock OUT3 and its inverse OUT3B. Duty-cycle adjustment circuit 234 receives input clock IN4 and generates output clock OUT4 and its inverse OUT4B.

Switch 210 selects one of OUT1, OUT2, OUT3, OUT4 for input to the zero duty onset detector in calibration logic 250. Calibration logic 250 performs calibration procedure 100 (FIG. 13) on the selected output and adjusts its configuration setting while leaving constant the configuration settings for other, non-selected duty-cycle adjustment circuits 231-234. Only one of duty-cycle adjustment circuits 231-234 is calibrated by calibration logic 250 at any one time.

The logic overhead of calibration logic 250 can thus be shared among many duty-cycle adjustment circuits 231-234. The number of duty-cycle adjustment circuits 231-234 sharing calibration logic 250 can be more or less than four. A single zero duty onset detector (FIG. 11) may be shared by all duty-cycle adjustment circuits 231-234, or each duty-cycle adjustment circuits 231-234 may have its own zero duty onset detector, and its Q2 selected by switch 210 rather than its output clock OUT.

ALTERNATE EMBODIMENTS

Several other embodiments are contemplated by the inventors. For example, while an input clock IN having a 50% duty cycle has been described, the input clock could have a different duty cycle, and the equations for determining divisor K could be adjusted by adjusting the constant 0.5 in the equations.

The input clock IN, output clock OUT and clock OUTB could have different voltage signal swings. Level shifters could be applied to adjust the voltage level to maintain the desired operation.

The granularity of selection of the duty cycle can be adjusted by the number of tap nodes between resistors and mux inputs in tunable voltage divider 80. As more resistors and more mux inputs are added, the step between adjacent duty-cycle settings is reduced. The values of series of resistors 81, 82, . . . 85, 86 could all have the same resistance value, or could have differing resistor values. Current sources 71-74 could all have the same current values, or could have different values, such as binary-weighted values. More than one of switches 42-44 could be closed at any one time to allow for larger values of current and VREF. Likewise, current sources 62-67 could all have the same current values, or could have different values, such as binary-weighted values. More than one of switches 52-57 could be closed at any one time to allow for larger values of charging current ID.

The calibration signals could be encoded in various formats, or may be fully decoded, or various combinations. The number of signal bits to control switched current-source array 60, tunable voltage reference 70, and tunable voltage divider 80 may vary from the examples. Additional configuration information may be added for various purposes.

While the zero duty onset condition has been described as causing the pulse of the output clock OUT to disappear, the OUT pulse could still be present, but be so small and narrow that it is unable to be clocked into first flip-flop 92 with the proper setup and hold timings. The zero duty onset condition does not have to have the peak voltage of VRAMP exactly equal VREF, but the zero duty onset condition occurs when these voltages are close to each other, such as within 10 mV. The zero duty onset detector can detect when the peak VRAMP and VREF are approximately equal to each other rather than exactly equal to each other, and the calibration still be useful. Exact zero duty onset detection is not necessary.

Using calibration logic 50 with duty-cycle adjustment circuit 30 can improve various systems. Jitter on a clock signal can be reduced. Visible artifacts and instability on a display can be reduced.

Switch 34 could be implemented as an n-channel transistor. The current through switch 34 could be ten times the charging current ID, or some other multiple of the charging current, or could be selected to be able to discharge capacitor 36 in a certain amount of time, such as in $1/10^{th}$ of the clock period. Current sources could be implemented as p-channel transistors with gates connected to a bias voltage. Switches in switched current-source array 60 and tunable voltage reference 70 could be p-channel transistors or could be transmission gates each with a p-channel transistor in parallel with an n-channel transistor. The current source and switch could be combined by gating the bias voltage with the switch control signal so that the bias voltage is turned off when the switch is open. For a p-channel current-source transistor, the bias voltage could be driven by the power-supply voltage to turn off the p-channel current-source transistor. Other implementations are possible.

Calibration logic 50 could be implemented in hardware, such as logic gates and flip-flops, sequencers, custom or semi-custom logic gates, logic arrays, etc., or could be implemented in firmware or software, or with various combinations. Fully differential rather than single-ended signals could be used for the clock signals or for other signals.

While a saw-tooth or triangle wave has been shown for the ramp voltage, the shape of the ramp voltage can vary and still be useful. The saw-tooth wave can be considered to be a type of triangle wave. The slope of VRAMP does not have to be linear since the comparator compares VRAMP to the threshold voltage.

While the integrator has been shown as being directly connected to the input of comparator 32, a capacitor or a resistor could be placed on the comparator input, between the integrator node and the comparator input node. This resistor or capacitor could also be considered to be part of comparator 32. The integrator may have other circuit arrangements and use more complex filters for the integrating capacitor. An integrating amplifier or an op amp may be used. The ramp voltage may be generated as a triangular wave by using both or only one of a charging current and a discharging current. A linear or close-to-linear ramp may be used, or other waveforms if adjustments are made to other circuitry.

Another alternative is a peak detector circuit followed by an ADC. The ADC circuit samples the VRAMP signal peak from the peak detector. The sampled peak is compared to VREF digitally, and then signals the calibration logic if the peak is close to the VREF. The comparison margin may be defined digitally.

While descriptions of current flows and operations have been presented, these are theoretical and the theories may be incomplete or even incorrect. Regardless of the physical mechanisms and theoretical interpretations, calibration logic does offer better tuning of clock edges. Especially for small devices, currents may flow in unusual ways and using mechanisms that have not yet been thoroughly researched and understood. Current may be negative currents rather than positive currents, and currents may flow in reverse directions. Current sources may sink rather than source currents in some inverted circuits. Power and ground may be swapped for an inverted or complementary circuit arrangement.

While binary-weighted conversion has been described, other weightings could be substituted, such as decimally-weighted, prime-weighted, or linearly-weighted, or octal-weighted. The digital value could be in these other number systems, such as octal numbers rather than binary numbers.

While D-type flip-flops have been described, other state-storage devices may be used, such as JK flip-flops, SR latches, etc. Inversions may be added by swapping inverting and non-inverting inputs or outputs as desired, but do not change the overall function and thus may be considered equivalents. The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A duty-cycle adjustor comprising:
   an integrator for integrating a charging current to generate a ramp voltage having a cycle controlled by an input clock;
   a switched current-source array for generating the charging current, wherein a magnitude of the charging current is selectable by first configuration signals;
   a comparator that compares the ramp voltage to a threshold voltage, the comparator driving an output clock to a first logic state when the ramp voltage is above the threshold voltage, the comparator driving an output clock to a second logic state that is a logical opposite of the first logic state when the ramp voltage is below the threshold voltage;
   a tunable voltage reference that generates a reference voltage, wherein a magnitude of the reference voltage is selectable by second configuration signals;
   a tunable voltage divider that divides the reference voltage by a divisor to generate the threshold voltage, wherein the divisor is determined by third configuration signals;
   a zero duty onset detector that examines the output clock and signals a zero duty onset condition when the output clock stops pulsing between the first logic state and the second logic state; and
   a calibration controller that performs calibration by adjusting the first and second configuration signals until the zero duty onset detector signals the zero duty onset condition, the calibration controller storing the first configuration signals and the second configuration signals as a stored configuration when the zero duty onset condition is signaled;
   wherein after calibration is completed, the calibration controller sends the first configuration signals from the stored configuration to the switched current-source array and sends the second configuration signals from the stored configuration to the tunable voltage reference,
   whereby the charging current and the reference voltage are adjusted by calibration detecting the zero duty onset condition.

2. The duty-cycle adjustor of claim 1 wherein the integrator further comprises:
   an integrating capacitor for integrating the charging current to generate the ramp voltage;
   an input switch, receiving the input clock, for discharging the integrating capacitor in response to the input clock.

3. The duty-cycle adjustor of claim 2 wherein during calibration the calibration controller sets the third configuration signals to set the divisor to 1;
   wherein the threshold voltage equals the reference voltage during calibration.

4. The duty-cycle adjustor of claim 3 wherein during calibration the calibration controller successively adjusts the first configuration signals to successively reduce the charging current until the zero duty onset condition is signaled,
   wherein the charging current is successively reduced during calibration.

5. The duty-cycle adjustor of claim 4 wherein during calibration the calibration controller adjusts the second configuration signals to increase the reference voltage when the charging current reaches a minimum setting for the charging current,
   wherein the reference voltage is increased during calibration when the charging current reaches the minimum setting.

6. The duty-cycle adjustor of claim 5 wherein the switched current-source array further comprises:
   a plurality of array current sources that generate a plurality of array currents;
   a plurality of array switches, coupled between the plurality of array current sources and an integrator node, the plurality of array switches for selecting currents in the plurality of array currents to be merged together to form the charging current;
   wherein the first configuration signals control the plurality of array switches to adjust the charging current;
   wherein the plurality of array switches, the integrating capacitor, and the input switch are connected together at the integrator node;
   wherein the ramp voltage is a voltage of the integrator node.

7. The duty-cycle adjustor of claim 6 wherein the integrator node is directly connected to an input of the comparator to conduct the ramp voltage to the comparator.

8. The duty-cycle adjustor of claim 6 wherein the tunable voltage reference further comprises:
   a plurality of current sources that receive a bias voltage, wherein the bias voltage controls current sourced by the plurality of current sources; and
   a plurality of switches to connect currents generated by the plurality of current sources to a reference node;
   wherein the reference node connects the tunable voltage reference to the tunable voltage divider;
   wherein currents from the plurality of current sources that are selected by the plurality of switches are combined at the reference node and flow through the tunable voltage divider;
   wherein a voltage of the reference node is the reference voltage.

9. The duty-cycle adjustor of claim 8 wherein the tunable voltage reference further comprises:
   a band gap reference for generating the bias voltage that is relatively independent of temperature and supply-voltage variations;
   wherein the bias voltage controls current sourced by the plurality of current sources.

10. The duty-cycle adjustor of claim 9 wherein the tunable voltage divider further comprises:
    a plurality of resistors that are connected in series between the reference node an a ground;
    a plurality of tap nodes between adjacent resistors in the plurality of resistors; and
    a mux having the plurality of tap nodes and the reference node as mux inputs, controlled by the third configuration signals that select one of the mux inputs to output as the threshold voltage.

11. The duty-cycle adjustor of claim 10 wherein the third configuration signals set a target duty cycle of the output clock, the target duty cycle being adjusted by calibration to compensate for variations in temperature, supply voltage, and process.

12. The duty-cycle adjustor of claim 11 wherein the input clock has a 50% duty cycle;
wherein the comparator further comprises a complementary output that generates a complementary output clock that is a logical inverse of the output clock;
wherein the output clock is selected for use by a downstream device when a target duty cycle is less than 50%;
wherein the complementary output clock is selected for use by the downstream device when the target duty cycle is more than 50%.

13. The duty-cycle adjustor of claim 11 wherein the input clock is a clock for synchronizing an input video stream;
wherein the output clock is a tuned clock for re-synchronizing the input video stream;
wherein video timing errors are reduced by using the tuned clock.

14. A method for calibrating a duty-cycle controller comprising:
configuring a tunable voltage reference to generate a reference voltage having a minimum value;
configuring a tunable voltage divider to pass the reference voltage through to a threshold voltage;
configuring a switched current-source array to generate a charging current having a maximum value;
operating an integrator to charge a capacitor using the charging current and to discharge the capacitor in response to an input clock to generate a ramp voltage;
comparing the ramp voltage to the threshold voltage and driving an output clock to a first state when the ramp voltage is less than the threshold voltage, and driving the output clock to a second state when the ramp voltage is less than the threshold voltage;
monitoring the output clock and signaling a zero duty onset condition when the output clock stops pulsing between the first state and the second state;
when the zero duty onset condition is not yet signaled, successively reducing the charging current until a minimum charging current is reached;
when the zero duty onset condition is not yet signaled and the minimum charging current is reached, successively increasing the reference voltage;
when the zero duty onset condition is not yet signaled and the minimum charging current is reached, and a maximum of the reference voltage is reached, signaling a calibration limit;
when the zero duty onset condition is signaled, storing a configuration setting of the switched current-source array and of the tunable voltage reference and using this configuration setting for operation of the duty-cycle controller to generate the output clock; and
when the zero duty onset condition is signaled, applying a target configuration setting for the tunable voltage divider that causes the tunable voltage divider to divide the reference voltage by a divisor K to generate the threshold voltage, wherein K is more than one, wherein the target configuration setting determines a target duty cycle for the output clock.

15. The method of claim 14 wherein configuring the tunable voltage reference further comprises applying first configuration signals generated by calibration logic to the tunable voltage reference, the first configuration signals determining a tunable current to the tunable voltage divider.

16. The method of claim 15 wherein configuring the switched current-source array further comprises applying second configuration signals generated by calibration logic to the switched current-source array, the second configuration signals determining the charging current generated by the switched current-source array and applied to the integrator.

17. The method of claim 16 wherein monitoring the output clock and signaling the zero duty onset condition when the output clock stops pulsing between the first state and the second state comprises:
using the output clock to latch a pre-determined signal into a first flip-flop;
using a delayed input clock to reset the first flip-flop;
using the input clock to clock an output of the first flip-flop into a second flip-flop; and
signaling the zero duty onset condition when an output of the second flip-flop changes between the first state and the second state.

18. A selectable duty-cycle clock generator comprising:
a voltage ramp generator that generates a ramp voltage having a triangular waveform that is synchronized to an input clock;
a signal strength adjuster that adjusts a peak voltage of the ramp voltage in response to first configuration signals;
a comparator that compares the ramp voltage to a threshold voltage to generate an output clock;
a tunable voltage reference that generates a reference voltage determined by second configuration signals;
a tunable voltage divider that dividers the reference voltage to generate the threshold voltage, the tunable voltage divider dividing the reference voltage by an amount determined by third configuration signals;
a zero duty detector for detecting a calibration endpoint when the output clock has a zero duty cycle wherein pulses of the output clock have an insufficient pulse width to meet timing requirements; and
calibration logic that receives a target duty cycle and drives the third configuration signals with a value causing the output clock to have the target duty cycle during a normal operation mode;
wherein the calibration logic further comprising means for performing a calibration routine to generate a calibrated set of the first and second calibration signals that cause the zero duty cycle to detect the calibration endpoint;
wherein the calibration logic applies the calibrated set of the first calibration signals to the signal strength adjuster and applies the calibrated set of the second calibration signals to the tunable voltage reference during the normal operation mode;
whereby the target duty cycle is calibrated.

19. The selectable duty-cycle clock generator of claim 18 wherein the calibration logic drives the third configuration signals to a calibration value that causes the tunable voltage divider to drive the reference voltage to the comparator in place of the threshold voltage during the calibration routine;
wherein the ramp voltage is calibrated to the reference voltage during the calibration routine while the ramp voltage is compared to the threshold voltage during the normal operation mode.

20. The selectable duty-cycle clock generator of claim 19 wherein the voltage ramp generator further comprises:
an integrating capacitor that generates the ramp voltage on an integrating node;
a discharge switch for discharging the integrating capacitor in response to the input clock;

wherein the signal strength adjuster further comprises:
a switched current-source array having a plurality of current sources that are selectively enabled by the first configuration signals to adjust a charging current to the integrating capacitor.

\* \* \* \* \*